US008845854B2

(12) United States Patent
Lei et al.

(10) Patent No.: US 8,845,854 B2
(45) Date of Patent: Sep. 30, 2014

(54) LASER, PLASMA ETCH, AND BACKSIDE GRIND PROCESS FOR WAFER DICING

(71) Applicant: Applied Materials, Inc., Santa Clara, CA (US)

(72) Inventors: Wei-Sheng Lei, San Jose, CA (US); Brad Eaton, Menlo Park, CA (US); Madhava Rao Yalamanchili, Morgan Hill, CA (US); Saravjeet Singh, Santa Clara, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/938,537

(22) Filed: Jul. 10, 2013

(65) Prior Publication Data

US 2014/0017880 A1    Jan. 16, 2014

Related U.S. Application Data

(60) Provisional application No. 61/790,976, filed on Mar. 15, 2013, provisional application No. 61/671,617, filed on Jul. 13, 2012.

(51) Int. Cl.
  *H01L 21/00*    (2006.01)
  *C23F 1/00*    (2006.01)
  *C23C 16/00*    (2006.01)
  *H01L 21/78*    (2006.01)

(52) U.S. Cl.
  CPC ..................................... *H01L 21/78* (2013.01)
  USPC .................. 156/345.32; 156/345.31; 118/719

(58) Field of Classification Search
  USPC .......................... 118/719; 156/345.31–345.32
  See application file for complete search history.

(56) References Cited

U.S. PATENT DOCUMENTS 4,049,944 A    9/1977    Garvin et al.
5,593,606 A    1/1997    Owen et al.
(Continued)

FOREIGN PATENT DOCUMENTS

JP    9216085    8/1997
JP    10321908    12/1998
(Continued)

OTHER PUBLICATIONS

Linder, V. et al., "Water-Soluble Sacrificial Layers for Surface", www.small-journal.com, 2005, 1, No. 7, 7 Pages.

(Continued)

*Primary Examiner* — Karla Moore
(74) *Attorney, Agent, or Firm* — Blakely Sokoloff Taylor & Zafman LLP (57) ABSTRACT

Front side laser scribing and plasma etch are performed followed by back side grind to singulate integrated circuit chips (ICs). A mask is formed covering ICs formed on the wafer, as well as any bumps providing an interface to the ICs. The mask is patterned by laser scribing to provide a patterned mask with gaps. The patterning exposes regions of the semiconductor wafer, below thin film layers from which the ICs are formed. The semiconductor wafer is then etched through the gaps in the patterned mask to advance a front of an etched trench partially through the semiconductor wafer thickness. The front side mask is removed, a backside grind tape applied to the front side, and a back side grind performed to reach the etched trench, thereby singulating the ICs.

9 Claims, 6 Drawing Sheets

(56) References Cited

U.S. PATENT DOCUMENTS

| | | |
|---|---|---|
| 6,057,180 A | 5/2000 | Sun et al. |
| 6,174,271 B1 | 1/2001 | Kosmowski et al. |
| 6,306,731 B1 | 10/2001 | Igarashi et al. |
| 6,407,363 B2 | 6/2002 | Dunsky et al. |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler et al. |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2005/0023260 A1* | 2/2005 | Takyu et al. .............. 219/121.67 |
| 2006/0043535 A1 | 3/2006 | Hiatt |
| 2006/0205182 A1 | 9/2006 | Soejima |
| 2009/0014052 A1* | 1/2009 | Borden et al. ................. 136/244 |
| 2009/0255911 A1 | 10/2009 | Krishnaswami et al. |
| 2010/0099238 A1* | 4/2010 | Vakanas et al. ............... 438/463 |
| 2010/0129984 A1* | 5/2010 | Vakanas et al. ............... 438/463 |
| 2013/0299088 A1* | 11/2013 | Lei et al. ..................... 156/345.1 |
| 2014/0011337 A1* | 1/2014 | Holden et al. ................ 438/463 |
| 2014/0011338 A1* | 1/2014 | Lei et al. ...................... 438/463 |
| 2014/0017879 A1* | 1/2014 | Chowdhury et al. ......... 438/462 |
| 2014/0057414 A1* | 2/2014 | Iyer et al. ..................... 438/463 |
| 2014/0065797 A1* | 3/2014 | Yalamanchili et al. ....... 438/462 |
| 2014/0106542 A1* | 4/2014 | Chowdhury et al. ......... 438/462 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al,, "Apparatus and Methods for Dry Etch With Edge, Side and Back Protection", U.S. Appl. No. 61/491,693, filed May 31, 2011 24 Pages.

* cited by examiner

LASER, PLASMA ETCH, AND BACKSIDE GRIND PROCESS FOR WAFER DICING

CROSS REFERENCE TO RELATED APPLICATIONS

This application claims the benefit of priority to U.S. Provisional Application No. 61/790,976 filed on Mar. 15, 2013, titled "LASER, PLASMA ETCH, AND BACKSIDE GRIND PROCESS FOR WAFER DICING," and U.S. Provisional Application No. 61/671,617 filed on Jul. 13, 2012, titled "LASER, PLASMA ETCH, AND BACKSIDE GRIND PROCESS FOR WAFER DICING," the entire contents of which are hereby incorporated by reference in their entirety for all purposes.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits; three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

One or more embodiments of the invention are directed to methods of dicing semiconductor wafers, each wafer having a plurality of integrated circuits thereon.

According to one embodiment, a method of dicing a semiconductor wafer including a plurality of integrated circuits involves forming a mask above the semiconductor wafer. The mask covers and protects the integrated circuits. The method involves patterning the mask with a laser scribing process to provide a patterned mask with gaps, exposing regions of the semiconductor wafer between the integrated circuits. The method also includes etching the semiconductor wafer through the gaps in the patterned mask to advance a trench partially through the semiconductor wafer. The method also includes back side grinding the semiconductor wafer to reach the etched trench.

According to one embodiment, a system for dicing a substrate including a plurality of integrated circuits (ICs) includes a laser scribe module to pattern a multi-layered mask disposed above a substrate to form a trench exposing regions of a substrate between the ICs. The system also includes a plasma etch module physically coupled to the laser scribe module to plasma etch the substrate. The system also includes a back side grinding module to perform back side grinding of the substrate to reach the etched trench. The system also includes a robotic transfer chamber to transfer a laser scribed substrate from the laser scribe module to the plasma etch module.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Methods of dicing semiconductor wafers, each wafer having a plurality of integrated circuits thereon, are described. In the following description, numerous specific details are set forth, such as laser and plasma etch wafer dicing approaches with UV-curable adhesive films, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

When dicing wafers that are 300 µm or thicker, the wafers are rigid enough to be directly placed on mounting tapes without die attach film (DAF). In circumstances where wafers are placed on mounting tapes without DAF, no DAF cutting process is involved. Embodiments described herein address the dicing applications of integrated circuit (IC) wafers (e.g., integrated wafers with processor chips) that have a thickness of 300 µm to 800 µm, but preferably in the range of 300 µm to 600 µm thickness. Furthermore, embodiments address dicing applications of integrated circuit wafers with an acceptable dicing kerf width of 50 µm to 200 µm width, preferably 50 µm to 100 µm measured on the wafer front surface. A kerf width of 50 µm to 100 µm measured on the wafer front surface corresponds to a typical kerf width measured from the back side of the wafer of 30-50 µm in a laser/saw hybrid process.

In embodiments, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

In embodiments, a method uses a hybrid approach employing laser scribing, plasma etching, and wafer back side grinding to dice the wafers with thickness' ranging from 250 µm to 750 µm. The laser scribing removes difficult-to-etch passivation layers, dielectric layers, and metal layers until the underlying silicon substrate is exposed. Plasma etching generates trenches of a depth to the target die thickness. Finally, backside grinding removes the remaining silicon thickness until the etched trenches are reached to realize die singulation. An advantage of an embodiment employing this hybrid singulation technique is a well-balanced dicing quality due to laser scribing and plasma etch, and increased throughput through further incorporation of backside grinding. The use of laser and plasma etch can be an advantageous extension of the dicing before grinding (DBG) approach to thick die singulation, where typically a laser or blade saw first cuts trenches into the semiconductor wafer to the desired die thickness, immediately followed by the backside grinding. According to one embodiment, the proposed approach uses both laser scribing and plasma etching instead of only laser scribing or blade sawing to generate trenches in a semiconductor wafer. In one embodiment, a method using laser scribing and plasma etching dices wafers that are 250 µm or thicker. Embodiments of the invention fit into current production flow easily and have improved throughput over techniques lacking plasma etching.

Figure 1:
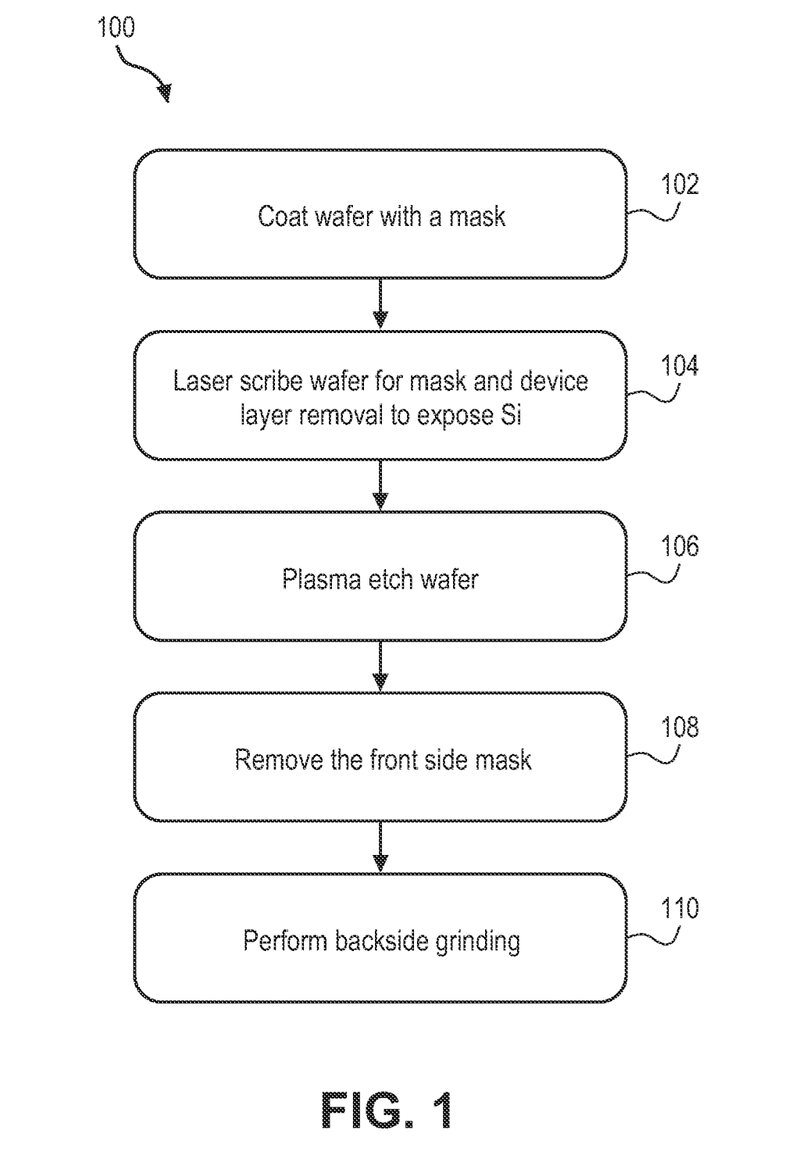
FIG. 1 is a flowchart representing operations in a method of dicing a semiconductor wafer including a plurality of integrated circuits, in accordance with an embodiment of the present invention.

FIG. 1 illustrates operations in a method of dicing a semiconductor wafer including a plurality of integrated circuits, in accordance with an embodiment of the present invention. FIGS. 2A-2D illustrate cross-sectional views of a semiconductor wafer including a plurality of integrated circuits during performance of the methods.

Figure 2A:
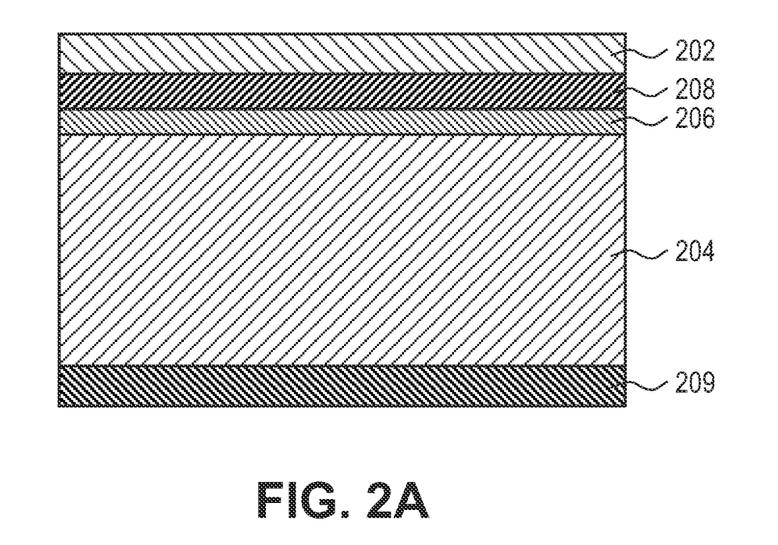
FIGS. 2A, 2B, 2C, and 2D illustrate cross-sectional views of a semiconductor wafer including a plurality of integrated circuits during performance of a method of dicing the semiconductor wafer, corresponding to operations of FIG. 1, in accordance with embodiments of the present invention.

During the first operation 102 of the method 100 of FIG. 1, and corresponding to FIG. 2A, a front side mask 202 is formed above a semiconductor wafer or substrate 204. According to one embodiment, the semiconductor wafer or substrate 204 has a diameter of at least 300 mm and has a thickness prior to back side grinding of 300 µm to 800 µm. As illustrated, in an embodiment, the mask is a conformal mask. Conformal mask embodiments advantageously ensure sufficient thickness of the mask over an underlying topography (e.g., 20 µm bumps, not shown) to survive the duration of a plasma etch dicing operation. In alternative embodiments, however, the mask is a non-conformal, planarized mask (e.g., thickness of the mask over a bump is less than thickness of the mask in a valley). Formation of a conformal mask may be by CVD, for example, or by any other process known in the art. In one embodiment, the mask 202 covers and protects integrated circuits (ICs) formed on the surface of semiconductor wafer and also protects bump projecting or protruding up 10-20 µm from the surface of the semiconductor wafer. The mask 202 also covers intervening streets formed between adjacent ones of the integrated circuits.

In accordance with an embodiment of the present invention, forming the mask 202 includes forming a layer such as, but not limited to, a water-soluble layer (PVA, etc.), and/or a photo-resist layer, and/or an I-line patterning layer. For example, a polymer layer such as a photo-resist layer may be composed of a material otherwise suitable for use in a lithographic process. In embodiments with multiple mask layers, a water-soluble base coat may be disposed below a non-water-soluble overcoat. The basecoat then provides a means of stripping the overcoat while the overcoat provides plasma etch resistance and/or for good mask ablation by the laser scribing process. It has been found for example, that mask materials transparent to the laser wavelength employed in the scribing process contribute to low die edge strength. Hence, a water-soluble base coat, of PVA, for example, as the first mask material layer, may function as a means of undercutting a plasma-resistant/laser energy absorbing overcoat layer of the mask so that the entire mask may be removed/lifted off from the underlying integrated circuit (IC) thin film layer. The water-soluble base coat may further serve as a barrier protecting the IC thin film layer from the process used to strip the energy absorbing mask layer. In embodiments, the laser energy absorbing mask layer is UV-curable and/or UV absorbing, and/or green-band (500-540 nm) absorbing. Exemplary materials include many photo-resists and polyimide (PI) materials conventionally employed for passivation layers of IC chips. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

Referring again to FIG. 2A, the semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps and passivation layers 208 may be formed above the interconnect layers. Materials making up the streets may be similar to or the same as those materials used to form the integrated circuits. For example, streets may be composed of layers of dielectric materials, semiconductor materials, and metallization. In one embodiment, one or more of the streets includes test devices similar to the actual devices of the integrated circuits.

Figure 2B:
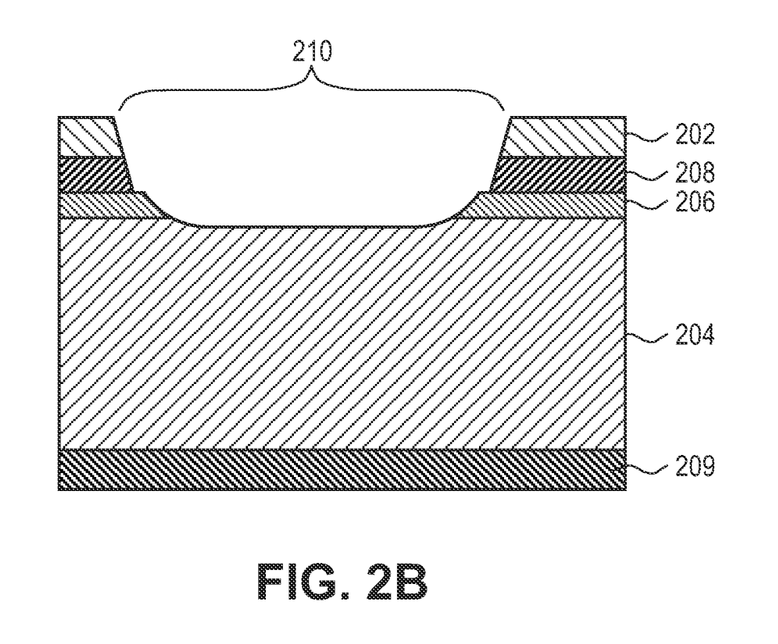

Returning to FIG. 1, and turning to corresponding FIG. 2B, the method 100 proceeds with bulk target layer material removal at operation 104. To minimize dielectric delamination and cracking, a femtosecond laser is preferred. However, depending on the device structure, an ultraviolet (UV), picosecond, or nanosecond laser source can also be applied. The laser has a pulse repetition frequency in the range of 80 kHz to 1 MHz, ideally in the range of 100 kHz to 500 kHz.

Referring again to FIG. 2B, the laser scribing process is performed generally to remove the material of the streets present between the integrated circuits 206. In accordance with an embodiment of the present invention, patterning the mask 202 with the laser scribing process includes forming trenches 210 partially into the regions of the semiconductor wafer between the integrated circuits. In an embodiment, patterning the mask with the laser scribing process includes direct writing a pattern using a laser having a pulse width in the femtosecond range. Specifically, a laser with a wavelength in the visible spectrum (e.g., green band, or 500-540 nm) or the ultra-violet (UV, or 300-400 nm band) or infra-red (IR) band (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask, the streets and, possibly, a portion of the semiconductor wafer or substrate.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

Figure 3:
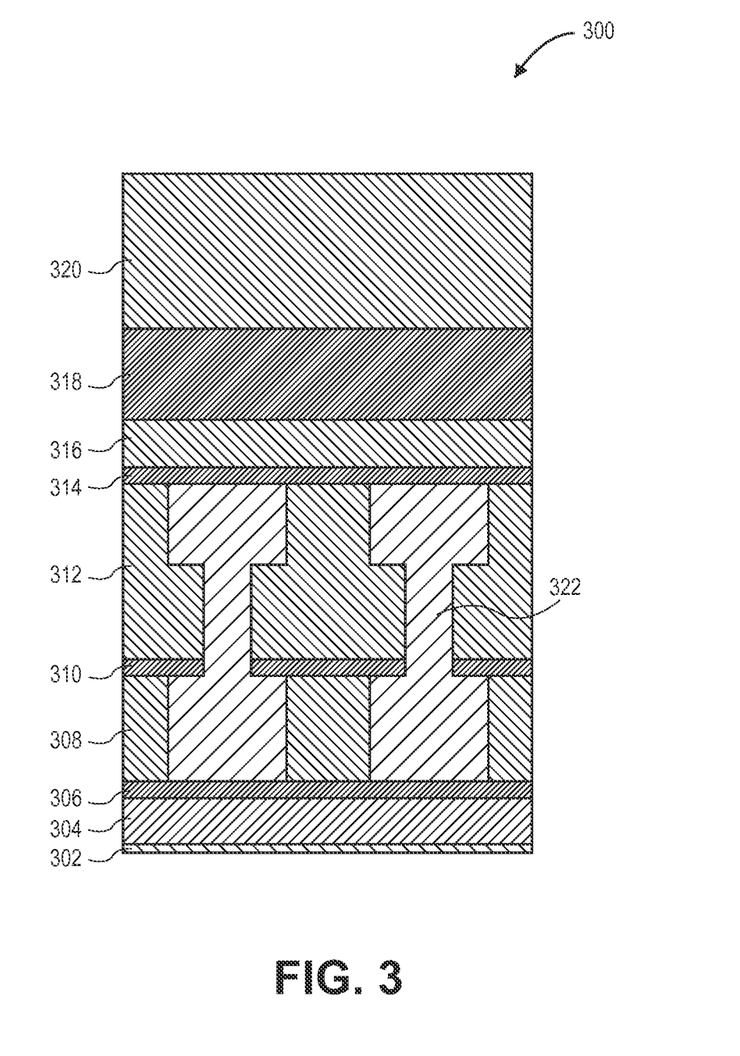
FIG. 3 illustrates a cross-sectional view of a stack of materials that may be present in a street region of a semiconductor wafer or substrate, in accordance with embodiments of the present invention.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present invention. Referring to FIG. 3, a street region 300 includes the top portion 302 of a silicon substrate, a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photo-resist 320 or some other mask. Copper metallization 322 is disposed between the first and third etch stop layers 306 and 314 and through the second etch stop layer 310. In a specific embodiment, the first, second and third etch stop layers 306, 310 and 314 are composed of silicon nitride, while low K dielectric layers 308 and 312 are composed of a carbon-doped silicon oxide material.

Under conventional laser irradiation (such as nanosecond-based or picosecond-based laser irradiation), the materials of street 300 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate. In another embodiment, pulses of approximately less than or equal to 500 femtoseconds are used.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength close to (e.g., 500-540 nm), or in the UV range (e.g., 300-400 nm) provides a cleaner ablation process than a femtosecond-based laser process having a wavelength close to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Figure 2C:
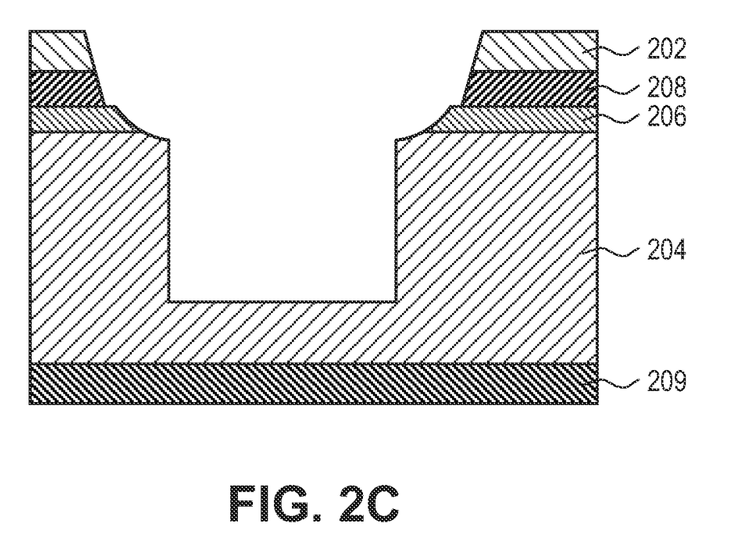

Returning to FIG. 1, and turning to corresponding FIG. 2C, the semiconductor wafer is next plasma etched at operation 106. As illustrated in FIG. 2C, the plasma etch front proceeds through the gaps in the patterned mask 202. In accordance with an embodiment of the present invention, etching the semiconductor wafer includes etching the trenches formed with the laser scribing process so as to not etch entirely through semiconductor wafer. In one embodiment, the plasma etching operation employs a through-silicon via type etch process.

In a specific embodiment, during the etch process the etch rate of the material of the silicon of the semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates (e.g., 40 µm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_6$, $C_4F_8$, $CF_4$, $CHF_3$, $XeF_2$, or any other reactant gas capable of etching silicon at a relatively fast etch rate.

Figure 2D:
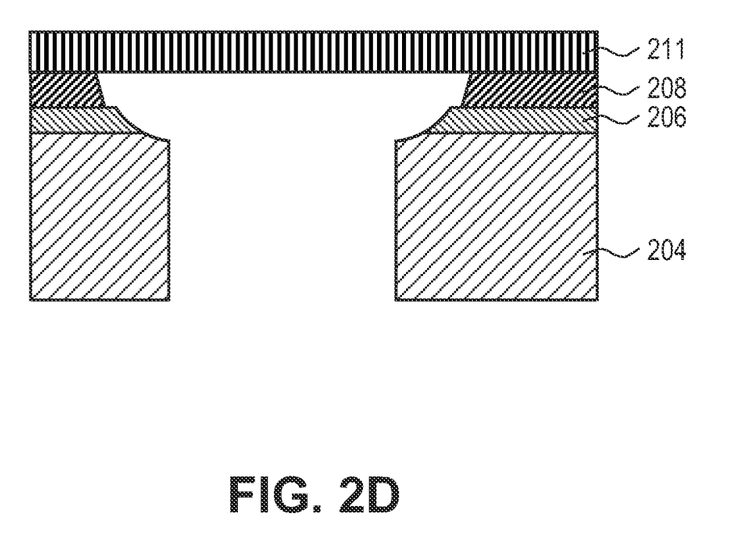

Returning to FIG. 1, and turning to FIG. 2D, following the plasma etch at operation 106, the integrated circuits remain coupled together by the substrate 204. According to one embodiment, a backside grinding operation 110 is then performed to polish through the substrate to reach the plasma etched trench and singulate the IC chips. In the exemplary embodiment of method 100, the front side mask is first removed at operation 108. According to one embodiment, the backside tape 209 is removed, and tape 211 (e.g., back side grinding (BSG) tape or other protection tape) is applied to the front side. Any conventional BSG process is then performed at operation 110.

Figure 4:
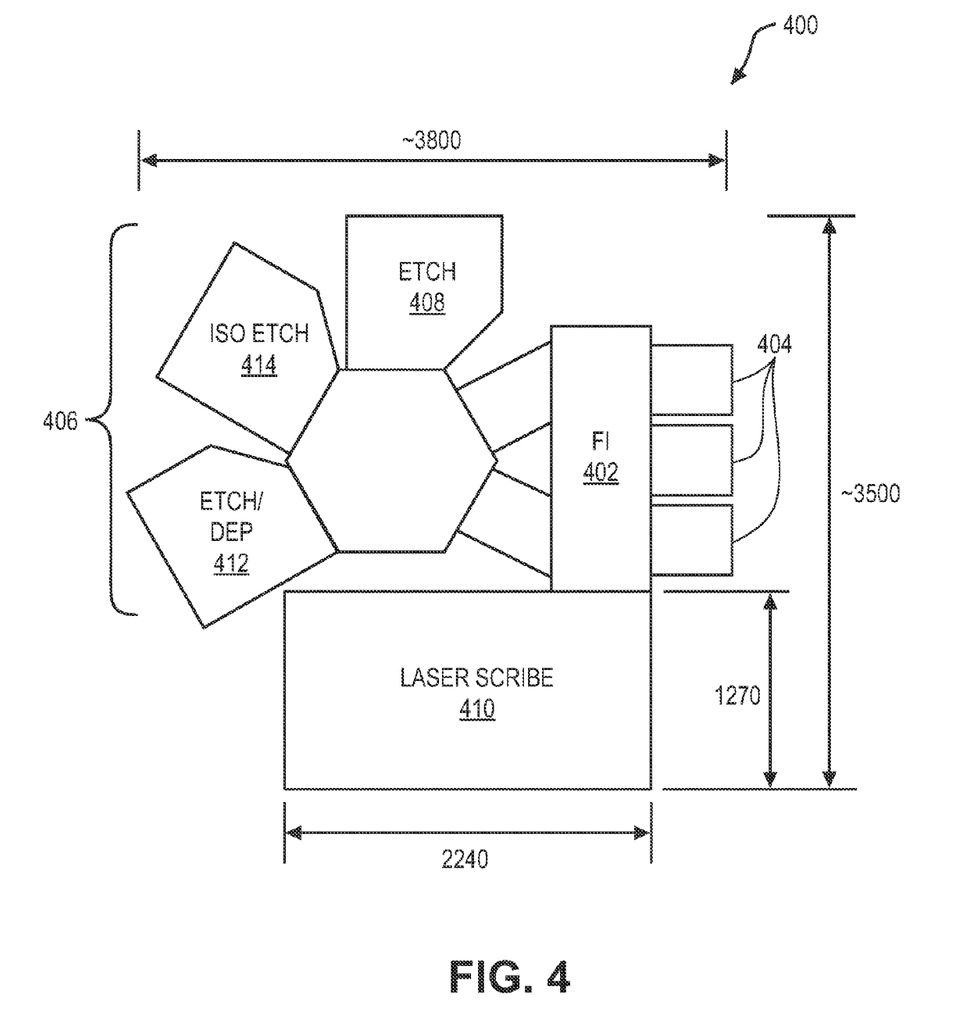
FIG. 4 illustrates a block diagram of a tool layout for laser and plasma dicing of substrates with an integrated deposition module for in-situ application of a multi-layered mask, in accordance with an embodiment of the present invention.

Turning to FIG. 4, a single integrated platform 400 may be configured to perform many or all of the operations in the hybrid laser ablation-plasma etch singulation process 100. For example, FIG. 4 illustrates a block diagram of a cluster tool 406 coupled with laser scribe apparatus 410 for laser and plasma dicing of substrates, in accordance with an embodiment of the present invention. Referring to FIG. 4, the cluster tool 406 is coupled to a factory interface 402 (FI) having a plurality of load locks 404. The factory interface 402 may be a suitable atmospheric port to interface between an outside manufacturing facility with laser scribe apparatus 410 and cluster tool 406. The factory interface 402 may include robots with arms or blades for transferring substrates (or carriers thereof) from storage units (such as front opening unified pods) into either cluster tool 406 or laser scribe apparatus 410, or both.

A laser scribe apparatus 410 is also coupled to the FI 402. In an embodiment, the laser scribe apparatus 410 includes a femtosecond laser operating in the 300-540 nm band. The femtosecond laser to performing the laser ablation portion of the hybrid laser and etch singulation process 100. In one embodiment, a moveable stage is also included in laser scribe apparatus 410, the moveable stage configured for moving a wafer or substrate (or a carrier thereof) relative to the femtosecond-based laser. In a specific embodiment, the femtosecond laser is also moveable.

The cluster tool 406 includes one or more plasma etch chambers 408 coupled to the FI by a robotic transfer chamber 450 housing a robotic arm for in-vaccuo transfer of substrates. The plasma etch chambers 408 is suitable for performing a plasma etch portion of the hybrid laser and etch singulation process 100. In one exemplary embodiment, the plasma etch chamber 408 is further coupled to an $SF_6$ gas source and at least one of a $C_4F_8$ and $C_4F_6$ source. In one embodiment, the plasma etch chamber 408 is coupled to an $SF_6$ gas source and at least one of a $C_4F_8$, $CF_4$, and $C_4F_6$ source. In a specific embodiment, the one or more plasma etch chambers 408 is an Applied Centura® Silvia™ Etch system, available from Applied Materials of Sunnyvale, Calif., USA, although other suitable etch systems are also available commercially. In an embodiment, more than one etch chamber 408 is included in the cluster tool 406 portion of integrated platform 400 to enable high manufacturing throughput of the singulation or dicing process.

The cluster tool 406 may include other chambers suitable for performing functions in the hybrid laser ablation-plasma etch singulation process 100. In the exemplary embodiment illustrated in FIG. 4, the cluster tool 406 includes both a mask formation module 412 and a wet station 414, though either may be provided in absence of the other. The mask formation module 412 may be a spin coating module. As a spin coating module, a rotatable chuck is configured to clamp by vacuum, or otherwise, a thinned substrate mounted on a carrier such as backing tape mounted on a frame. In further embodiments, the spin coating module is fluidly coupled to an aqueous solution source.

Embodiments of the wet station 414 are to dissolve the water-soluble mask material layer after plasma etching the substrate. The wet station 414 may include for example a pressurized spray jet to dispense water other solvent.

Figure 5:
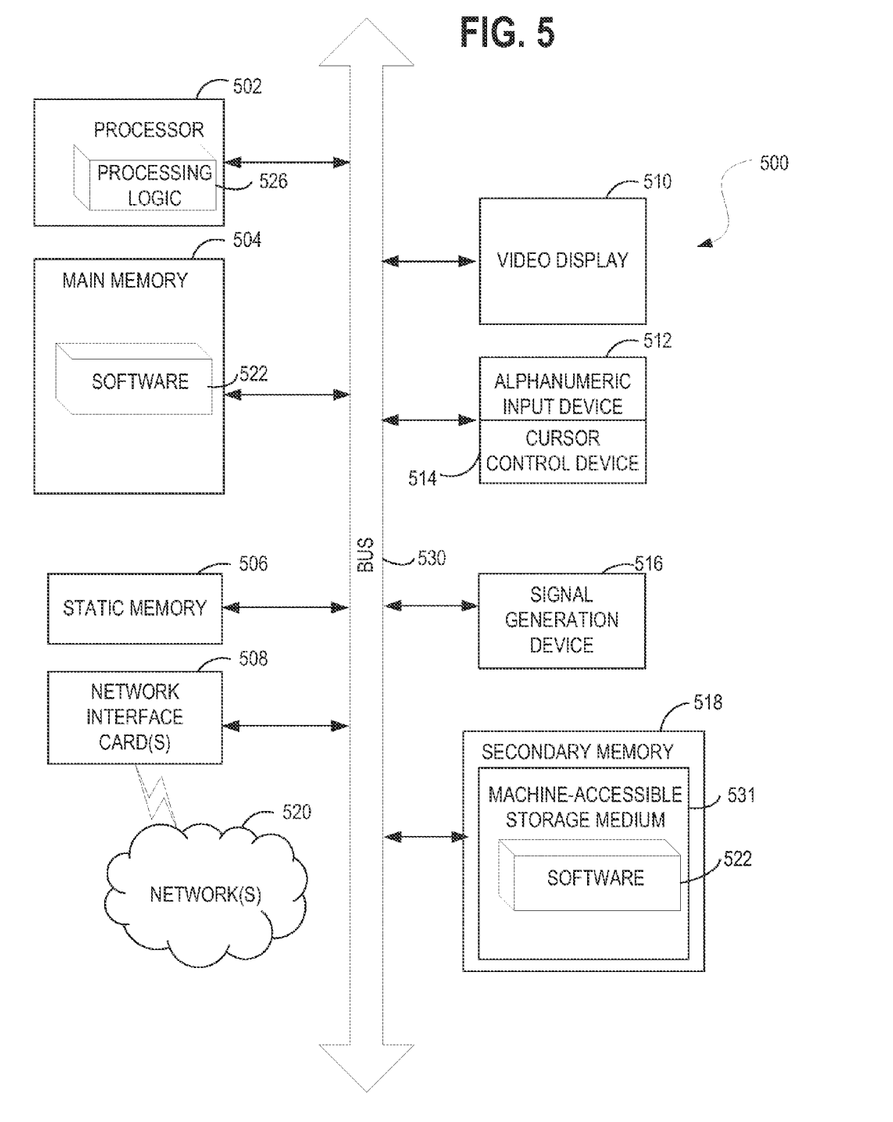
FIG. 5 illustrates a block diagram of an exemplary computer system which controls automated performance of one or more operation in the masking, laser scribing, plasma dicing methods described herein, in accordance with an embodiment of the present invention.

FIG. 5 illustrates a computer system 500 within which a set of instructions, for causing the machine to execute one or more of the scribing methods discussed herein may be executed. The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, etc. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations and steps discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A system for dicing a substrate comprising a plurality of integrated circuits (ICs), the system comprising:
   a laser scribe module;
   a plasma etch module physically coupled to the laser scribe module;
   a back side grinding module;
   a computing device comprising a processor and memory storing instructions executable by the processor to cause:
      the laser scribe module to pattern a mask disposed above the substrate to form a trench exposing regions of the substrate between the ICs,
      the plasma etch module to plasma etch the substrate to advance the trench partially through the substrate, and
      the back side grinding module to perform back side grinding of the substrate to reach the etched trench; and
   a robotic transfer chamber to transfer a laser scribed substrate from the laser scribe module to the plasma etch module.

2. The system of claim 1, wherein the laser scribe module comprises a femtosecond laser having a wavelength less than or equal to 540 nanometers and a pulse width of less than or equal to 400 femtoseconds.

3. The system of claim 1, further comprising a tape applicator, wherein the instructions further cause the tape applicator to apply a protection tape on a front side of the substrate after laser scribing and plasma etching, and prior to the back side grinding.

4. The system of claim 1, further comprising a tape applicator, wherein the instructions further cause the tape applicator to apply a protection tape to a back side of the substrate prior to laser scribing and plasma etching.

5. The system of claim 1, further comprising a deposition module, wherein the instructions further cause the deposition module to form the mask over the substrate.

6. The system of claim 5, wherein the instructions further cause the deposition module to deposit a multi-layered mask comprising a water-soluble mask layer as a base coat and a non-water-soluble mask layer as an overcoat on top of the base coat.

7. The system of claim 1, wherein the instructions further terminate laser scribing upon formation of the trench having a depth in a range of 5 to 50 μm.

8. The system of claim 1, wherein the plasma etch module uses $SF_6$ and at least one of $C_4F_8$ and $C_4F_6$.

9. The system of claim 1, wherein the instructions further cause the laser scribe module to remove the mask following the plasma etch and prior to the back side grinding.

* * * * *